US006566643B2

(12) United States Patent
Morita

(10) Patent No.: US 6,566,643 B2
(45) Date of Patent: May 20, 2003

(54) ELECTRO-OPTICAL DEVICE, METHOD OF DRIVING THE SAME, AND ELECTRONIC APPARATUS USING THE SAME

(75) Inventor: Akira Morita, Suwa (JP)

(73) Assignee: Seiko Epson Corporation, Tokyo (JP)

(*) Notice: Subject to any disclaimer, the term of this patent is extended or adjusted under 35 U.S.C. 154(b) by 141 days.

(21) Appl. No.: 09/899,931

(22) Filed: Jul. 9, 2001

(65) Prior Publication Data

US 2002/0033440 A1 Mar. 21, 2002

(30) Foreign Application Priority Data

Jul. 11, 2000 (JP) ....................................... 2000-209564

(51) Int. Cl.[7] ................................................ H01L 27/00

(52) U.S. Cl. ............................... 250/208.1; 250/214 R; 345/204

(58) Field of Search .......................... 250/208.1, 214 R, 250/234, 235, 226; 348/302, 307, 308, 309; 345/204–214, 96; 257/291, 440

(56) References Cited

U.S. PATENT DOCUMENTS 6,025,835 A * 2/2000 Aoki et al. ................. 345/204

* cited by examiner

*Primary Examiner*—Que T. Le
(74) *Attorney, Agent, or Firm*—Oliff & Berridge, PLC

(57) ABSTRACT

A liquid crystal panel has odd-numbered data lines $X_a$ to which a positive data signal voltage is supplied and even-numbered data lines $X_b$ to which a negative data signal voltage is supplied. The liquid crystal panel has M×N pixels P (m, n) that are arranged in such a manner that each pixel P(m, n) corresponds to one of the odd-numbered data lines and one of the even-numbered data lines that is adjacent to the one odd-numbered data line. The aperture portion of each pixel P (m, n) is provided with a switching element that is connected to a scanning line $Y_m$ and one of the data lines $X_a$, and a switching element that is connected to the scanning line $Y_m$ and one of the data lines $X_b$ that is adjacent to the one data line $X_a$. In performing dot inversion driving on this liquid crystal device, a data line driving circuit supplies positive data signal voltages to the data lines $X_a$ and negative data signal voltages to the data lines $X_b$. In synchronism with this operation, a scanning line driving circuit controls opening/closing of the two switching elements.

14 Claims, 12 Drawing Sheets

AFTER A LAPSE OF ONE FRAME PERIOD

AFTER A LAPSE OF ONE FRAME PERIOD

ELECTRO-OPTICAL DEVICE, METHOD OF DRIVING THE SAME, AND ELECTRONIC APPARATUS USING THE SAME

Japanese Patent Application No. 2000-209564, filed Jul. 11, 2000, is hereby incorporated by reference in its entirety.

BACKGROUND OF THE INVENTION

1. Field of the Invention

The present invention relates to an electro-optical device, a method of driving the electro-optical device, and an electronic apparatus using the electro-optical device.

2. Description of Related Art

At present, in TFT (thin-film transistor) liquid crystal devices, for example, AC voltage driving methods such as frame inversion driving, line inversion driving, and dot inversion driving are used. Among those driving methods, the dot inversion driving method is a driving method capable of preventing flicker and a luminance gradient. As shown in FIG. 12A, the dot inversion driving method is such that the phase is inverted on a pixel-by-pixel basis. The operation of a liquid crystal device using the dot inversion method will be described below by using one particular pixel P(1, 1) as an example.

FIG. 12B shows how the voltage $V_{P(1,\ 1)}$ of the pixel P (1, 1) varies with time in a case where a data signal voltage $+V_1$ or $-V_1$ is applied to the pixel P (1, 1). Symbols $t_1$, $t_2$, . . . represent the starts of frame periods $f_1$, $f_2$, . . . and symbol $H_1$ represents one horizontal scanning period (selection period).

In the frame period $f_1$, when the data signal voltage $+V_1$ is applied to the pixel P (1, 1), the pixel voltage $V_{P\ (1,\ 1)}$ increases along a charging characteristic curve $C_{a1}$, reaches the data signal voltage $+V_1$ at a time point $t_{a1}$ in the selection period, and is stabilized thereafter. In the frame period $f_2$, when the data signal voltage $-V_1$ is applied to the pixel P (1, 1), the pixel voltage $V_{P\ (1,\ 1)}$ decreases along a charging characteristic curve $C_{a2}$, reaches the data signal voltage $-V_1$ at a time point $t_{a2}$ in the selection period, and is stabilized thereafter. Since this liquid crystal device employs the dot inversion driving method, the data signal voltage is changed between $+V_1$ and $-V_1$ (the polarity is reversed). Every time the frame period is changed, a voltage change of about $2V_1$ should occur in the pixel P (1, 1). To cause the voltage change of $2V_1$ in the pixel P (1, 1) every time the frame period is changed, charging from $-V_1$ to $+V_1$ or from $+V_1$ to $-V_1$ should be effected. In the liquid crystal panel, charging to a voltage corresponding to the wiring capacitance of each data line also occurs. This results in a problem that charging a pixel to a predetermined voltage in the selection period becomes more difficult as the distance between the source of the data signal voltages such as a data line driving circuit and the pixel to be charged becomes longer or the screen size of the liquid crystal device becomes larger. This phenomenon is more remarkable when the voltage change to be caused by charging each pixel is larger.

SUMMARY OF THE INVENTION

According to the present invention, in a case where an electro-optical device is driven by the dot inversion driving method, the amplitude of data signal voltages supplied to each pixel can approximately be halved. An objective of the invention is to provide an electro-optical device capable of reducing the power consumption and charging each pixel sufficiently within the selection period, as well as a driving method of such an electro-optical device and an electronic apparatus using such an electro-optical device.

To solve the above problems, the present invention provides an electro-optical device comprising: a plurality of data line pairs extending in a first direction, each of the data line pairs including a first data line to which a data signal of a first polarity is supplied and a second data line to which a data signal of a second polarity is supplied;

a plurality of scanning lines extending in a second direction that intersects the first direction;

a plurality of pixels arranged at intersections of the data lines pairs and the scanning lines;

a scanning line driving circuit which supplies each of the scanning lines with a scanning signal for selecting one of the scanning lines in a selection period; and a data line driving circuit which includes a data line switching circuit and supplies the first and second data lines of the data line pairs with the data signals of the first and second polarities, respectively, wherein the data line switching circuit selects one of the first and second data lines of each of the data line pairs alternately along the second direction in a t-th selection period (t is a natural number) of a k-th (k is a natural number) frame period, and then in the (t+1)-th selection period, selects the other of the first and second data lines of each of the data line pairs which has not been selected in the t-th selection period.

The invention also provides a method of driving an electro-optical device, wherein the electro-optical device comprises:

a plurality of data line pairs extending in a first direction, each of the data line pairs including a first data line to which a data signal of a first polarity is supplied and a second data line to which a data signal of a second polarity is supplied;

a plurality of scanning lines extending in a second direction that intersects the first direction;

a plurality of pixels arranged so as to correspond to intersections of the data lines pairs and the scanning lines;

a scanning line driving circuit which supplies each of the scanning lines with a scanning signal for selecting one of the scanning lines in a selection period; and a data line driving circuit which supplies the first and second data lines of the data line pairs with the data signals of the first and second polarities, respectively; and wherein the data line driving circuit selects one of the first and second data lines of each of the data line pairs alternately along the second direction in a t-th selection period (t is a natural number) of a k-th (k is a natural number) frame period, and then in the (t+1)-th selection period, selects the other of the first and second data lines of each of the data line pairs which has not been selected in the t-th selection period.

DETAILED DESCRIPTION OF THE EMBODIMENTS

Figure 1:
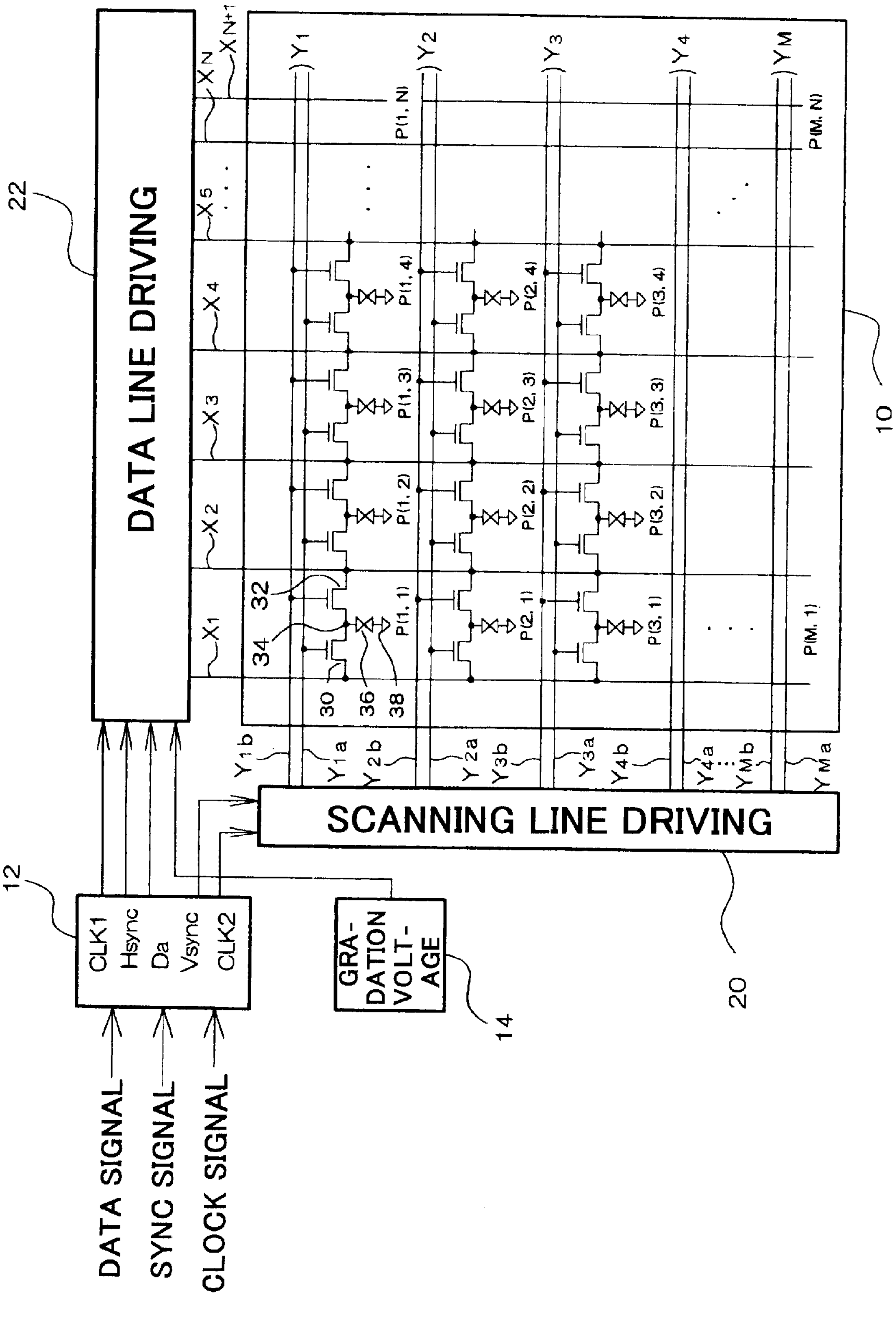
FIG. 1 shows a liquid crystal device according to a first embodiment of the present invention.

According to one embodiment of the present invention, there is provided an electro-optical device comprising:

- a plurality of data line pairs extending in a first direction, each of the data line pairs including a first data line to which a data signal of a first polarity is supplied and a second data line to which a data signal of a second polarity is supplied;
- a plurality of scanning lines extending in a second direction that intersects the first direction;
- a plurality of pixels arranged so as to correspond to intersections of the data lines pairs and the scanning lines;
- a scanning line driving circuit which supplies each of the scanning lines with a scanning signal for selecting one of the scanning lines in a selection period; and
- a data line driving circuit which includes a data line switching circuit and supplies the first and second data lines of the data line pairs with the data signals of the first and second polarities, respectively,
- wherein the data line switching circuit selects one of the first and second data lines of each of the data line pairs alternately along the second direction in a t-th selection period (t is a natural number) of a k-th (k is a natural number) frame period, and then in the (t+1)-th selection period, selects the other of the first and second data lines of each of the data line pairs which has not been selected in the t-th selection period.

In this electro-optical device and its driving method, only a data signal having a predetermined polarity such as a positive polarity or a negative polarity is supplied to each data line of the electro-optical panel. In driving this electro-optical device by the dot inversion driving method in which the voltage of each pixel is reversed every frame period and every selection period, each data line is always supplied with data signals having voltages of the same polarity. Therefore, the variation amplitude of the voltage of each data line can be reduced and hence the power consumption also can be reduced. Further, each pixel can be charged sufficiently in a predetermined selection period.

Each adjacent pairs of the data line pairs may share one data line as the first data line and the second data line.

By causing each adjacent pairs of the data line pairs to share one data line to which data signals of the same polarity are supplied, the number of the data lines in the liquid crystal panel according to the embodiment of the present invention can be only one more than that of the conventional liquid crystal panel.

The data line switching circuit may have a data line switching section, wherein in a t-th selection period of a (k+1)-th frame period, the data line switching section selects one of the first and second data lines of each of the data line pairs which has not been selected in the t-th selection period of the k-th frame period; and wherein in the (t+1)-th selection period of the (k+1)-th frame period, the data line switching section selects the other of the first and second data lines of each of the data line pairs which has not been selected in the (t+1)-th selection period of the k-th frame period.

With this configuration, a data line suitable for the polarity of each pixel to be charged in each frame period can be selected.

The scanning lines may be scanning line pairs each of which includes a first scanning line and a second scanning line. In this case, the electro-optical device may further comprise: a plurality of first switching elements each of which is connected to the first data line, the second scanning line of each of the scanning line pairs, and one of the pixels; and a plurality of second switching elements each of which is connected to the second data line, the first scanning line of each of the scanning line pairs, and one of the pixels.

In the electro-optical device having the first and second switching elements connected to the pixels, one of the first and second switching elements can be turned on by selecting the first scanning lines or the second scanning lines. Data signals are supplied to data lines connected via the one of the first and second switching elements. In this manner, control can be made in such a manner that each data line is supplied with a positive or negative voltage.

The scanning line driving circuit may comprise:

- a plurality of third switching elements each of which is connected to one of the first and second scanning lines of the scanning line pairs and turned on in the t-th selection period of the k-th frame period and in the (t+1)-th selection period of the (k+1)-th frame period; and
- a plurality of fourth switching elements each of which is connected to the other of the first and second scanning lines of each of the scanning line pairs and turned on in the (t+1)-th selection period of the k-th frame period and the t-th selection period of the (k+1)-th frame period.

When two of the first and second scanning lines are connected to the pixels, one of the first and second scanning lines can be selected to be driven by providing the third and fourth switching elements for the respective scanning line pairs.

In the electro-optical device according to the embodiment of the present invention, the data signals may include a signal R, a signal G, and a signal B; and one of the signals R, G and B can be supplied to each of the first and second data lines which are provided at both ends in the second direction, and two of the signals R, G and B can be supplied to each of the remaining first and second data lines.

By supplying one or two data signals via a single data line in the above manner, data signals having the same polarity are supplied to adjacent pixels via a single data line except for the data lines provided at both ends.

In the electro-optical device according to the embodiment of the invention, each of the pixels may have a capacitive electrical characteristic.

In the electro-optical device according to the embodiment of the invention, each of the pixels may include an electro-optical material that is driven by a thin-film transistor.

In the electro-optical device according to the embodiment of the invention, the electro-optical material may be a liquid crystal.

Embodiments of the present invention will be described below with reference to the drawings.

First Embodiment

FIG. 1 shows a TFT liquid crystal device according to a first embodiment of the invention.

The liquid crystal device is composed of a liquid crystal panel 10, a signal control circuit section 12, a gradation voltage circuit section 14, a scanning line driving circuit 20, and a data line driving circuit 22. In FIG. 1, the individual pixels of the liquid crystal panel 10 are denoted by P (1, 1), . . . , P (m, n), . . . P (M, N), where m, n, M, and N are integers that are greater than or equal to 2.

Reference characters Y and X generically denote scanning lines and data lines, respectively, and symbols $Y_1$, $Y_2$, . . . , $Y_M$ and $X_1$, $X_2$, . . . , $X_N$, $X_{N+1}$ denote individual scanning lines and data lines, respectively. Moreover, $Y_{1a}$, $Y_{1b}$, $Y_{2a}$, $Y_{2b}$, . . . , $Y_{Ma}$, $Y_{Mb}$ denote further specific scanning lines.

The scanning lines $Y_1$ to $Y_M$ and the data lines $X_1$ to $X_{N+1}$ are arranged in the liquid crystal panel 10 and the M×N pixels P (1, 1) to P (M, N) are formed so as to correspond to their crossing points. Each of the scanning lines $Y_1$ to $Y_M$ includes a pair of scanning lines; for example, the scanning line $Y_m$ includes scanning lines $Y_{ma}$ and $Y_{mb}$.

In the pixel P (1, 1), for example, of the liquid crystal panel 10, the data line $X_1$ and the scanning line $Y_{1a}$ are connected to the source and the gate, respectively, of a thin-film transistor (TFT) 30 and the data line $X_2$ and the scanning line $Y_{1b}$ are connected to the source and the gate, respectively, of a thin-film transistor (TFT) 32. The drains of the TFTs 30 and 32 are connected to a pixel electrode 34. A pixel capacitor 36 is formed with the pixel electrode 34 as one end. The other end of the pixel capacitor 36 is connected to a counter electrode 38 (not shown). Usually, each pixel is provided with a storage capacitor (not shown) for holding charge that also has the pixel electrode 34 as one end. The other (N×M−1) pixels P (1, 2) to P (M, N) have the same structure as the pixel P (1, 1).

The liquid crystal device of FIG. 1 is supplied externally with a data signal, a sync signal, and a clock signal.

Scanning Line Driving Circuit

Figure 2:
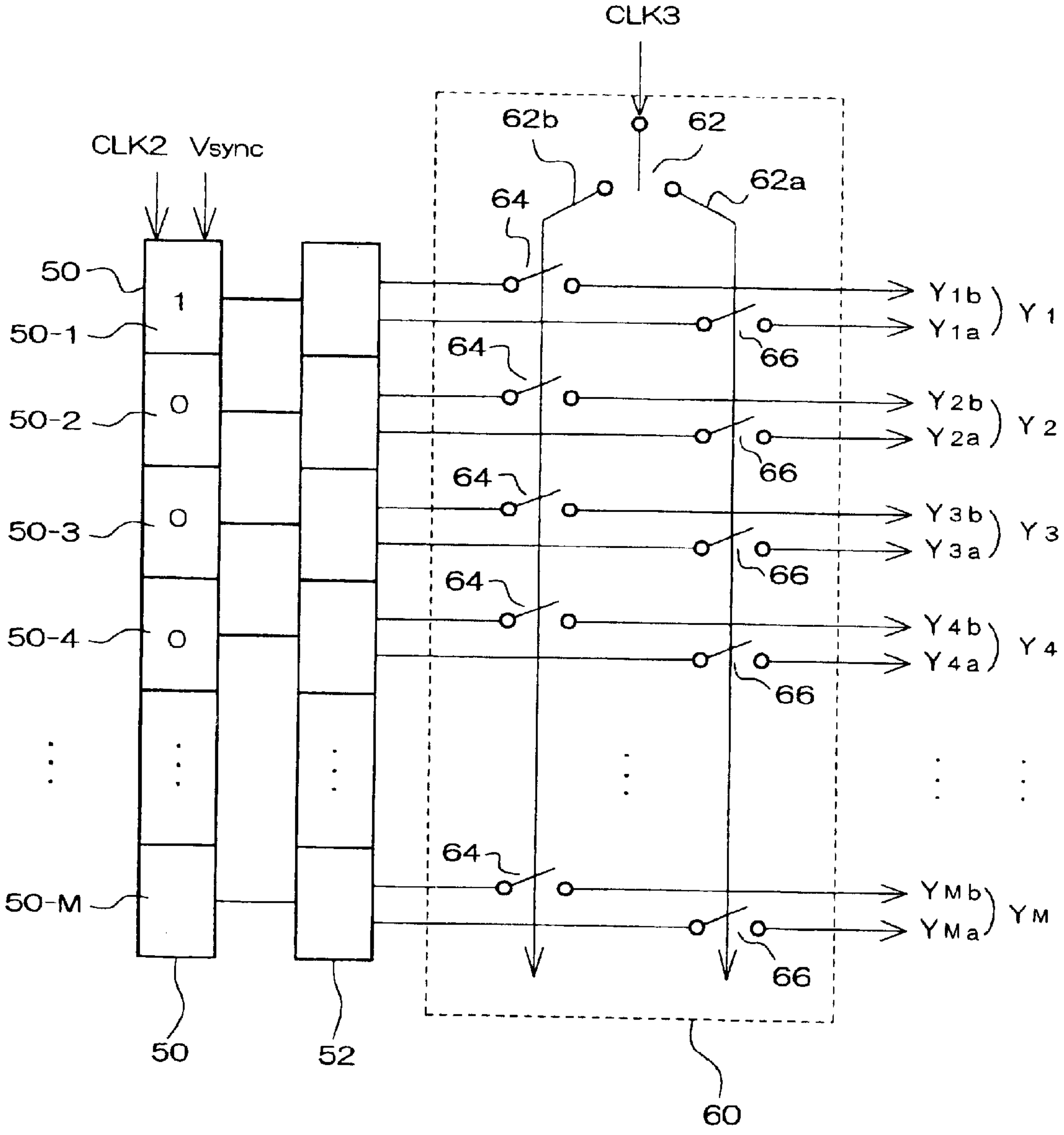
FIG. 2 shows an example of a scanning line driving circuit shown in FIG. 1.

The scanning line driving circuit 20 is supplied with a clock signal CLK2 and a vertical sync signal $V_{sync}$ from the signal control circuit section 12. For example, as shown in FIG. 2, the scanning line driving circuit 20 is composed of a shift register 50, an output circuit 52, and a scanning line switching circuit 60.

For example, the shift register 50 is configured in such a manner that M registers 55-1 to 55-M are connected to each other in series.

Each of the M registers 55-1 to 55-M of the shift register 50 is supplied with potentials "1" and "0." The output circuit 52 generates constant-level voltages based on the potentials ("1" or "0") supplied to the M registers 55-1 to 55-M and supplies the generated voltages to the scanning lines Y.

In the scanning line switching circuit 60, M switching elements 64 and M switching elements 66 are provided on the scanning lines Y. A control line 62*b* for controlling the opening/closing of the M switching elements 64 is connected to the M switching elements 64. Similarly, a control line 62*a* for controlling the opening/closing of the M switching elements 66 is connected to the M switching elements 66. A switching element 62 is supplied with a clock signal CLK3 that is supplied in synchronism with the vertical sync signal $V_{sync}$ and the clock signal CLK2. If the control line 62*b* is selected by the switching element 62, the switching elements 64 are turned on. If the control line 62*a* is selected by the switching element 62, the switching elements 66 are turned on. A detailed operation of the liquid crystal device based on the clock signal CLK3 that is used in the scanning line driving circuit 20.

Data Line Driving Circuit

Figure 3:
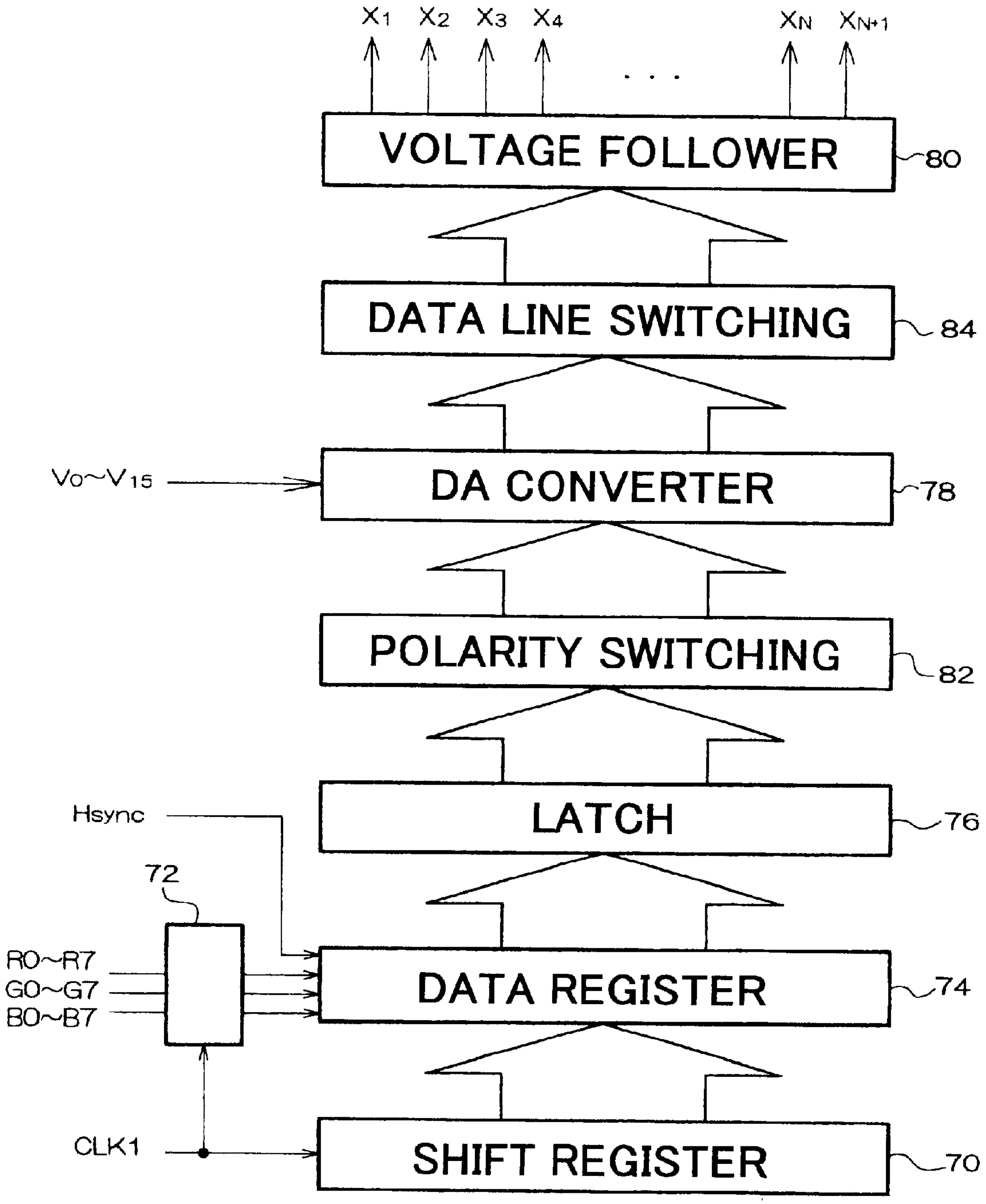
FIG. 3 is a block diagram showing the internal configuration of a data line driving circuit shown in FIG. 1.

The data line driving circuit 22 is supplied with a clock signal CLK1, a horizontal sync signal $H_{sync}$, and data signals $D_a$ from the signal control circuit section 12. As shown in FIG. 3, the data line driving circuit 22 shown in FIG. 1 is composed of a shift register 70, an input latch circuit 72, a data register 74, a latch circuit 76, a DA converter 78, a voltage follower 80, a polarity switching circuit 82, and a data line switching circuit 84.

The data signals $D_a$ that are supplied form the signal control circuit section 12 shown in FIG. 1 are RGB signals each being an 8-bit signal (about 16,770 thousand color display), for example. When each of the RGB signals is an 8-bit signal, each of the RGB signals is supplied serially to the input latch circuit 72 as R0 to R7, G0 to G7, or B0 to B7. The serial RGB signals are latched sequentially according to the timing of the clock signal CLK1 and then captured by the data register 74. When data registers of 100 clocks, for example, are prepared, 3 (RGB)×8 (bits)×100 clock signals are supplied to the data register 74 as one line data. The RGB signals of one line are latched by the latch circuit 76 according to the horizontal sync signal $H_{sync}$ that is supplied from the signal control circuit section 12. The RGB signals latched by the latch circuit 76 are supplied to the DA converter 78 via the polarity switching circuit 82. The RGB signals are converted into positive and negative analog data signal voltages $V_d$, by the DA converter 78 according to reference voltages V0 to V15, for example, that is supplied from the gradation voltage circuit section 14. The data signal voltages $V_d$, are supplied via the data line switching circuit 84 to the voltage follower 80, where they are impedance-converted. Resulting signals are supplied to the data lines X.

The configurations of the latch circuit 76, the polarity switching circuit 82, and the DA converter 78 will be described below.

Figure 4:
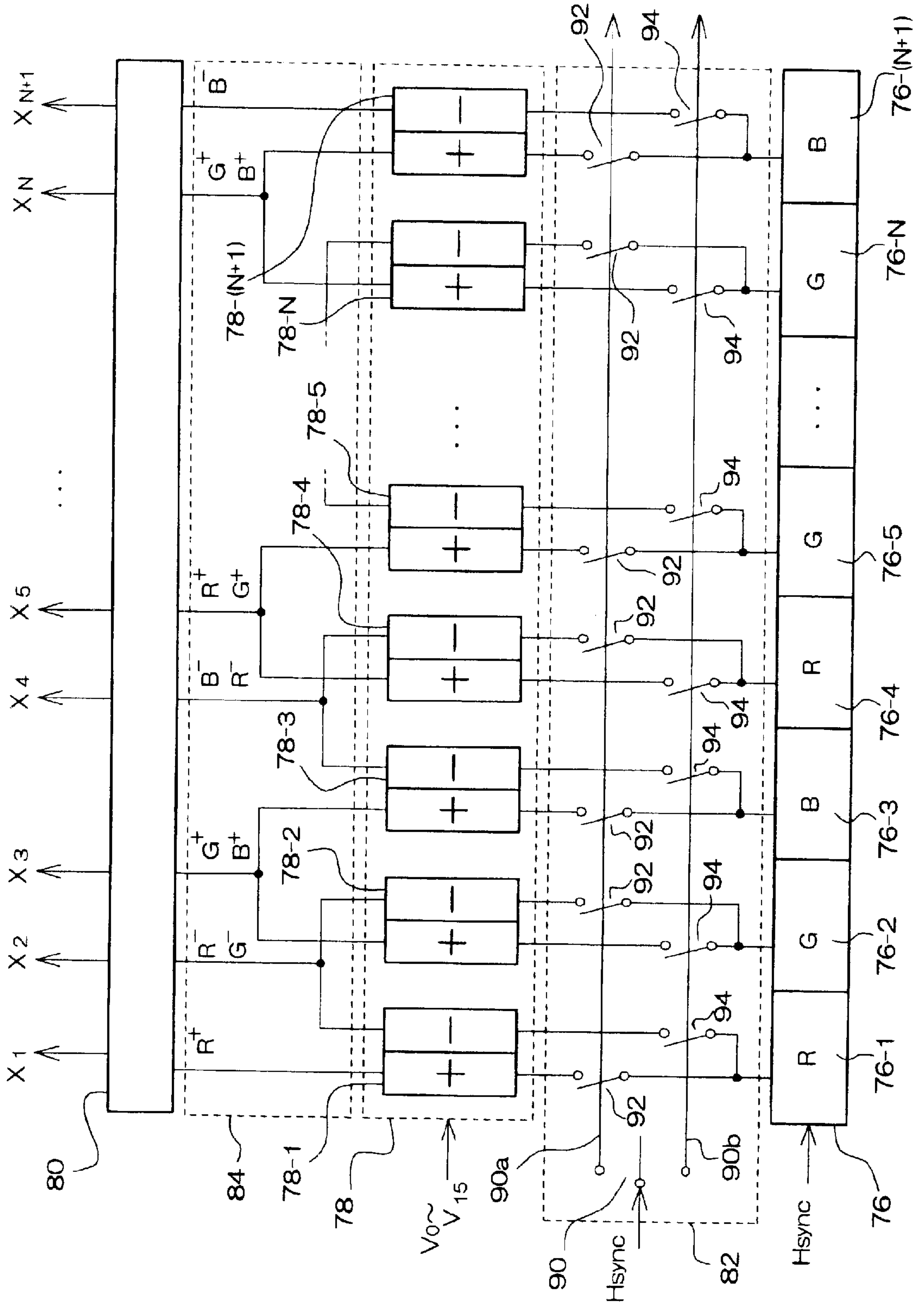
FIG. 4 is a detailed diagram of the internal block diagram shown in FIG. 3.

As shown in FIG. 4, the DA converter 78 has DA converters 78-1 to 78-(N+1) for converting RGB signals supplied from the latch circuit 76 into analog signals. Each of the DA converters 78-1 to 78-(N+1) has a function of converting an R, G, or B signal supplied from the latch circuit 76 into a positive or negative analog signal. As shown in FIG. 4, a positive (+) DA converter 78-1, for example, is used to convert an R, G, or B signal supplied into a positive analog signal and a negative (−) DA converter 78-1, for example, is used to convert an R, G, or B signal supplied into a negative analog signal. In this embodiment, the liquid crystal device is driven by the dot inversion driving method. Therefore, the polarity switching circuit 82 makes selection as to whether an R, G, or B signal that is supplied from the latch circuit 76 should be converted into a positive or negative analog signal.

The polarity switching circuit 82 has (N+1) switching elements 92 and (N+1) switching elements 94 on supply lines via which the RGB signals are supplied from the latch circuit 76 to the DA converter 78. The (N+1) switching elements 92 and the (N+1) switching elements 94 are opened or closed in synchronism with the supply of pulses of the horizontal sync signal $H_{sync}$ to a switching element 90.

If a control line 90*a* is selected by the switching element 90, the switching elements 92 are turned on. If a control line 90*b* is selected by the switching element 90, the switching elements 94 are turned on. The switching elements 92 are provided on the supply lines that are connected to the positive DA converter 78-1, the negative DA converter 78-2, the positive DA converter 78-3, . . . , the positive DA converter 78-(N+1), respectively. On the other hand, the switching elements 94 are provided on the supply lines that are connected to the negative DA converter 78-1, the positive DA converter 78-2, the negative DA converter 78-3, . . . , the negative DA converter 78-(N+1), respectively.

With the above configuration, selection as to whether each of the RGB signals supplied from the latch circuit 76 should be converted into a positive or negative analog signal is made every time a pulse of the horizontal sync signal $H_{sync}$ is supplied to the polarity switching circuit 82.

The data line switching circuit 84 are so wired that the RGB data signals $V_d$ that have been obtained by the DA converter 78 are supplied to the data lines X so as to have alternate polarities. The wiring pattern of the data lines witching circuit 84 will be described using, as an example, RGB signals that are latched by latch circuits 76-1 to 76-3.

If the switching element 92 is turned on, the R signal latched by the latch circuit 76-1 is converted by the positive DA converter 78-1 into a positive analog signal ($R^+$), which is supplied to the data line $X_1$ via the voltage follower 80. Conversely, if the switching element 94 is turned on, the R signal latched by the latch circuit 76-1 is converted by the negative DA converter 78-1 into a negative analog signal ($R^-$), which is supplied to the data line $X_2$ via the voltage follower 80. Similarly, the G signal latched by the latch circuit 76-2 is supplied as a negative data signal ($G^-$) to the data line $X_2$ and as a positive data signal ($G^+$) to the data line $X_3$. The B signal latched by the latch circuit 76-3 is supplied as a positive data signal ($B^+$) to the data line $X_3$ and as a negative data signal ($B^-$) to the data line $X_4$. The outputs of the DA converter 76 are connected to the data lines $X_1$ to $X_{n+1}$ via the voltage follower 80 according to the same rules as described above (the above connection relationship is one set).

Operation of Liquid Crystal Device

Figure 5:
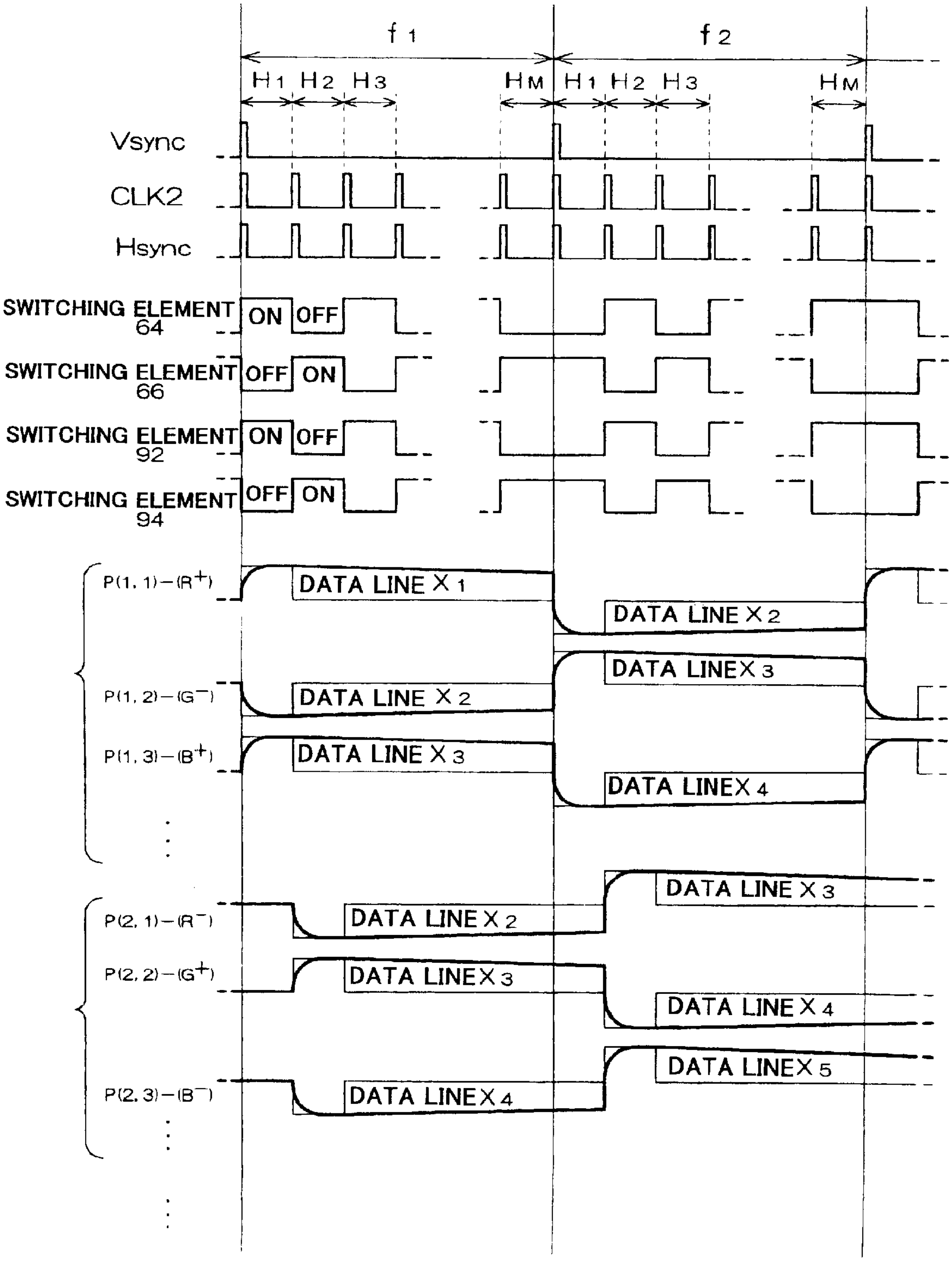
FIG. 5 is a timing chart showing the operation of the liquid crystal device of FIG. 1.
Figure 6A:
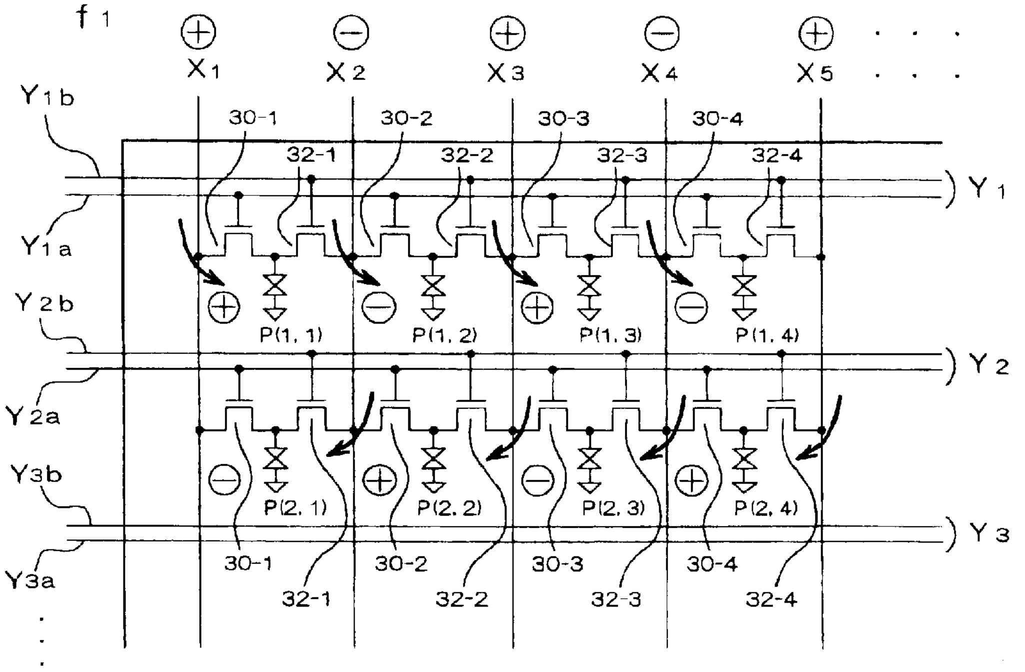
FIGS. 6A and 6B show polarity variations of the pixels of a liquid crystal panel shown in FIG. 1.
Figure 6B:
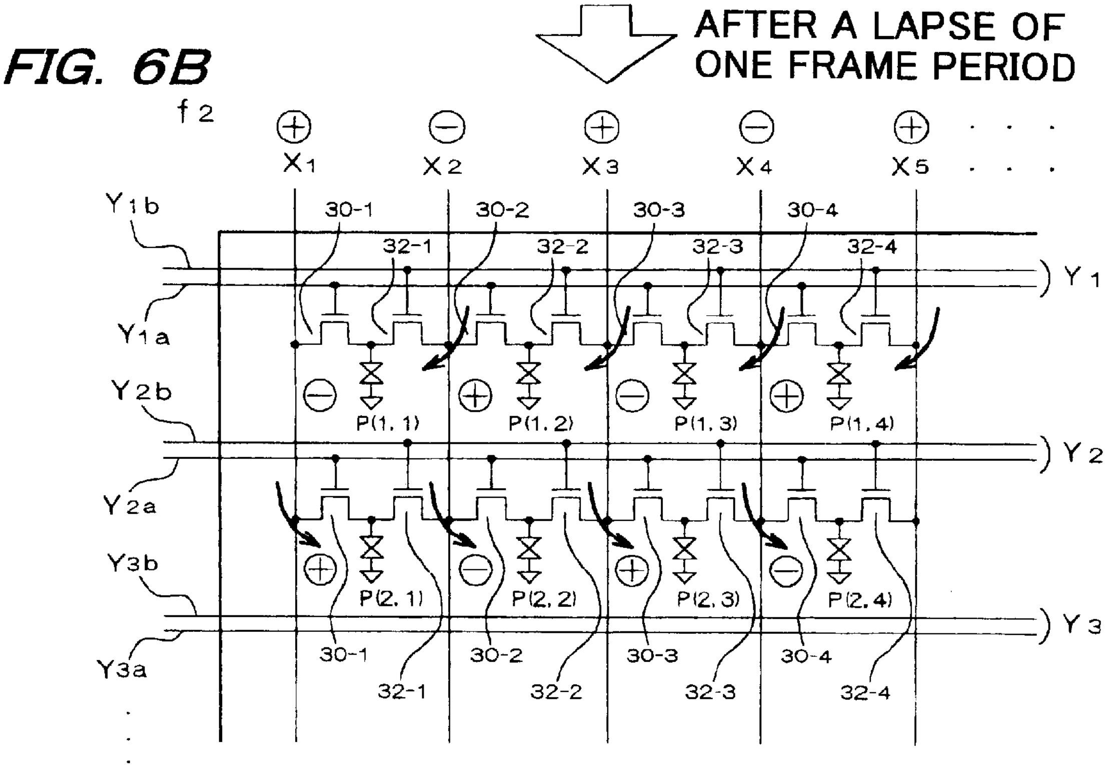

The operation of the liquid crystal device according to this embodiment having the scanning line driving circuit 20 and the data line driving circuit 22 that have been described above will be described below with reference to FIG. 5 and FIGS. 6A and 6B. FIG. 5 is a timing chart showing the operation of the liquid crystal device. FIGS. 6A and 6B schematically show polarity variations of the pixels of the liquid crystal panel 10.

Referring to FIG. 5, when a pulse of the vertical sync signal $V_{sync}$ is supplied to the scanning line driving circuit 20 in a selection period $H_1$ of a frame period $f_1$, a signal "1" is supplied to the shift register 50-1 shown in FIG. 2. At the same time, the control line 62*a* is selected by the switching element 62 based on the pulse of the vertical sync signal $V_{sync}$ (and a clock of the clock signal CLK2) that is supplied to the switching element 62 shown in FIG. 2, whereby the switching elements 66 are turned on. At the same time, a pulse of the horizontal sync signal $H_{sync}$ is supplied to the data line driving circuit 22. The control line 90*a* is selected by the switching element 90 shown in FIG. 4 based on the pulse of the horizontal sync signal $H_{sync}$, whereby the switching elements 92 are turned on. Therefore, an R signal stored in the latch circuit 76-1 shown in FIG. 4 is converted by the positive DA converter 78-1 into an analog $R^+$ signal, which is supplied to the data line $X_1$ via the voltage follower 80. The $R^+$ signal is supplied to the pixel P (1, 1) shown in FIG. 1. A G signal stored in the latch circuit 76-2 is converted by the negative DA converter 78-2 into an analog $G^-$ signal, which is supplied to the data line $X_2$ via the voltage follower 80. The $G^-$ signal is supplied to the pixel P (1, 2). A B signal stored in the latch circuit 76-3 is converted by the positive DA converter 78-3 into an analog $B^+$ signal, which is supplied to the data line $X_3$ via the voltage follower 80. The $B^+$ signal is supplied to the pixel P (1, 3). In similar manners, positive and negative analog signals obtained from the remaining RGB signals are distributed to the data lines $X_4$ to $X_N$.

FIG. 6A shows polarity variations of the pixels of the liquid crystal panel 10 in the above operation. As shown in FIG. 6A, in the selection period $H_1$, the positive data signal voltage $V_a$ ($R^+$) is supplied to the pixel P (1, 1) via the data line $X_1$ and the TFT 30-1. The negative data signal voltage $V_a$ ($G^-$) is supplied to the pixel P (1, 2) via the data line $X_2$ and the TFT 30-2. The positive data signal voltage $V_a$ ($B^+$) is supplied to the pixel P(1, 3) via the data line $X_3$ and the TFT 30-3.

Then, referring to FIG. 5, when the next clock of the clock signal CLK2 is supplied to the scanning line driving circuit 20 shown in FIG. 1 in a selection period $H_2$ of the frame period $f_1$, the signal "1" is shifted by one stage and supplied to the shift register 50-2 shown in FIG. 2. At the same time, the control line 62*b* is selected by the switching element 62 based on the clock of the clock signal CLK2 that is supplied to the switching element 62 shown in FIG. 2, whereby the switching elements 64 are turned on. At the same time, the next pulse of the horizontal sync signal $H_{sync}$ is supplied to the data line driving circuit 22 shown in FIG. 1. The control line 90*b* is selected by the switching element 90 shown in FIG. 4 based on the pulse of the horizontal sync signal $H_{sync}$, whereby the switching elements 94 are turned on. Therefore, an R signal stored in the latch circuit 76-1 shown in FIG. 4 is converted by the negative DA converter 78-1 into an analog $R^-$ signal, which is supplied to the data line $X_2$ via the voltage follower 80. The $R^-$ signal is supplied to the pixel P (2, 1). A G signal stored in the latch circuit 76-2 is converted by the positive DA converter 78-2 into an analog $G^+$ signal, which is supplied to the data line $X_3$ via the voltage follower 80. The $G^+$ signal is supplied to the pixel P (2, 2). A B signal stored in the latch circuit 76-3 is converted by the negative DA converter 78-3 into an analog $B^-$ signal, which is supplied to the data line $X_4$ via the voltage follower 80. The $B^-$ signal is supplied to the pixel P (2, 3). In similar manners, positive and negative analog signals obtained from the remaining RGB signals are distributed to the data lines $X_5$ to $X_{N+1}$.

FIG. 6A shows polarity variations of the pixels of the liquid crystal panel 10 in the above operation. As shown in FIG. 6A, in the selection period $H_2$, the negative data signal voltage $V_a$ ($R^-$) is supplied to the pixel P (2, 1) via the data line $X_2$ and the TFT 32-1. The positive data signal voltage $V_a$ ($G^+$) is supplied to the pixel P (2, 2) via the data line $X_3$ and the TFT 32-2. The negative data signal voltage $V_a$ ($B^-$) is supplied to the pixel P (2, 3) via the data line $X_4$ and the TFT 32-3.

As described above, as shown in FIG. 6A, to supply a positive data signal voltage $V_a$ to the pixel P (1, 1), for example, the data line $X_1$ is used to which only a positive signal voltage is supplied. To supply a negative data signal voltage $V_a$ to the pixel P (2, 1), for example, the data line $X_2$ is used to which only a negative signal voltage is supplied.

Then, in a selection period $H_1$ of a frame period $f_2$ shown in FIG. 5, the control line 62*b* is selected by the switching element 62 shown in FIG. 2, whereby the switching elements 64 are turned on. At the same time, the control line 90*b* is selected by the switching element 90 shown in FIG. 4, whereby the switching elements 94 are turned on. Therefore, an R signal stored in the latch circuit 76-1 shown in FIG. 4 is converted by the negative DA converter 78-1 into an analog $R^-$ signal, which is supplied to the data line $X_2$ via the voltage follower 80. A G signal stored in the latch circuit 76-2 is converted by the positive DA converter 78-2 into an analog $G^+$ signal, which is supplied to the data line $X_3$ via the voltage follower 80. A B signal stored in the latch circuit 76-3 is converted by the negative DA converter 78-3 into an analog $B^-$ signal, which is supplied to the data line $X_4$ via the voltage follower 80. In similar manners, positive and negative analog signals obtained from the remaining RGB signals are distributed to the data lines $X_5$ to $X_{N+1}$.

FIG. 6B shows polarity variations of the pixels of the liquid crystal panel 10 shown in FIG. 1 in the above operation. As shown in FIG. 6B, in the selection period $H_1$ shown in FIG. 5, the negative data signal voltage $V_a$ ($R^-$) is supplied to the pixel P (1, 1) via the data line $X_2$ and the TFT 32-1. The positive data signal voltage $V_a$ ($G^+$)is supplied to the pixel P (1, 2) via the data line $X_3$ and the TFT 32-2. The negative data signal voltage $V_a$ ($B^-$) is supplied to the pixel P (1, 3) via the data line $X_4$ and the TFT 32-3.

Then, in a selection period $H_2$ Of the frame period $f_1$ shown in FIG. 5, the control line 62*a* is selected by the switching element 62, whereby the switching elements 66 are turned on. At the same time, the control line 90*a* is selected by the switching element 90 shown in FIG. 4, whereby the switching elements 92 are turned on. Therefore, an R signal stored in the latch circuit 76-1 is is supplied to the data line $X_1$. A G signal stored in the latch circuit 76-2 is supplied to the data line $X_2$. A B signal stored in the latch circuit 76-3 is supplied to the data line $X_3$. In similar manners, positive and negative analog signals obtained from the remaining RGB signals are distributed to the data lines $X_4$ to $X_N$.

The positive data signal voltage $V_a$ ($R^+$) is supplied to the pixel P (2, 1) via the data line $X_1$ and the TFT 30-1. The negative data signal voltage $V_a$ ($G^-$) is supplied to the pixel P (2, 2) via the data line $X_2$ and the TFT 30-2. The positive data signal voltage $V_a$ ($B^+$) is supplied to the pixel P (2, 3) via the data line $X_3$ and the TFT 30-3.

With the above operation, the dot inversion driving is performed in which adjacent pixels have different polarities in each of the frame periods $f_1$ and $f_2$ and the polarity of each pixel varies every frame period. When a liquid crystal device is driven by the conventional dot inversion driving method, positive and negative data signal voltages $V_a$ are supplied to the pixel P (1, 1), for example, via the single data line $X_1$. In contrast, in the liquid crystal device according to this embodiment, as shown in FIGS. 6A and 6B, the pixel P (1, 1), for example, is connected to the data line $X_1$ to which a positive data signal voltage $V_a$ is supplied and the data line $X_2$ to which a negative data signal voltage $V_a$ is supplied. By performing control so that a data signal voltage $V_a$ can be supplied to the pixel P (1, 1) from either of the data lines $X_1$ and $X_2$, the voltage polarities of the respective data lines $X_1$ and $X_2$ can be fixed.

Figure 8:
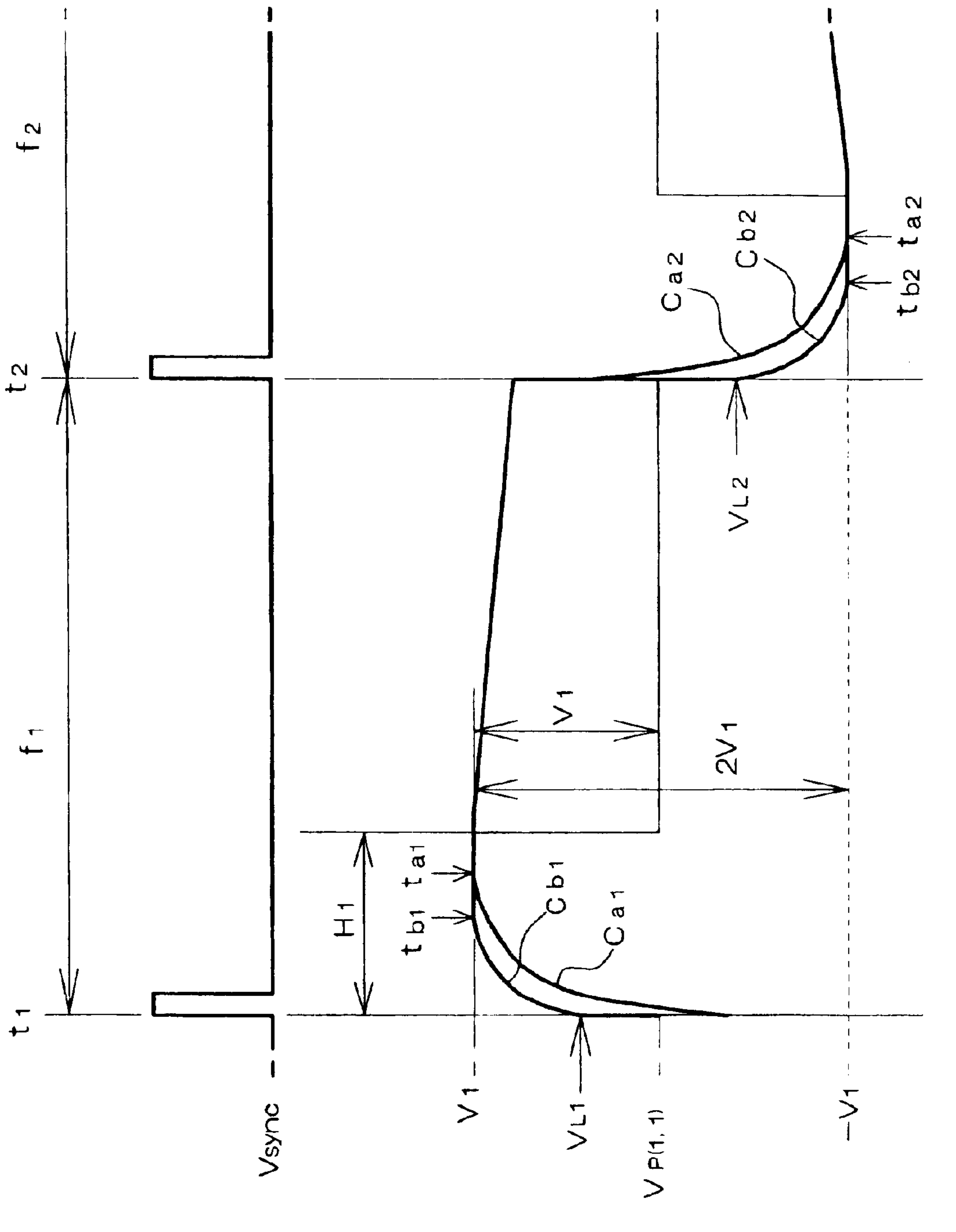
FIG. 8 is a timing chart showing the polarity variations of the pixels of the liquid crystal panel shown in FIGS. 6A and 6B.

When the liquid crystal device is driven by the dot inversion method in the above-described manner, the amplitude of the data signal voltage $V_a$ can be halved or made even smaller by dedicating each data line X to a positive or negative data signal voltage $V_a$. This means that, as shown in FIG. 8, the voltage amplitude of a data line X (e.g., the data line $X_1$) is decreased from $2V_1$ to $V_1$ in the selection period $H_1$, which contributes to reduction of the power that is consumed when the liquid crystal panel 10 is driven. Further, halving or making even smaller the voltage amplitude enable charging to the predetermined voltage $V_1$ faster. In the conventional dot inversion driving method, the charging characteristic assumes a curve $C_{a1}$ in which the voltage reaches the predetermined value $V_1$ at a time point $t_{a1}$ in the selection period $H_1$. In this embodiment, the charging characteristic assumes a curve $C_{b1}$ because the polarity is fixed for each data line X and charging is started in a state that a voltage ($V_{L1}$) corresponding to a parasitic capacitance plus a little more has already been established. With this charging characteristic $C_{b1}$, the voltage can reach the predetermined value $V_1$ at a time point $t_{b1}$ that precedes the time point $t_{a1}$ of the charging characteristic $C_{a1}$. Therefore, driving the liquid crystal device by the dot inversion driving method according to this embodiment solves the problem that charging a pixel sufficiently, that is, to a predetermined voltage, in a predetermined selection period becomes more difficult as the distance between the data line driving circuit as a voltage source and the pixel to be charged becomes longer.

Further, using the dot inversion driving method according to this embodiment in a large-screen liquid crystal panel can solve the problem that each pixel cannot be charged sufficiently, that is, to a predetermined voltage, in a predetermined selection period.

Modification to Data Line Driving Circuit

Figure 7:
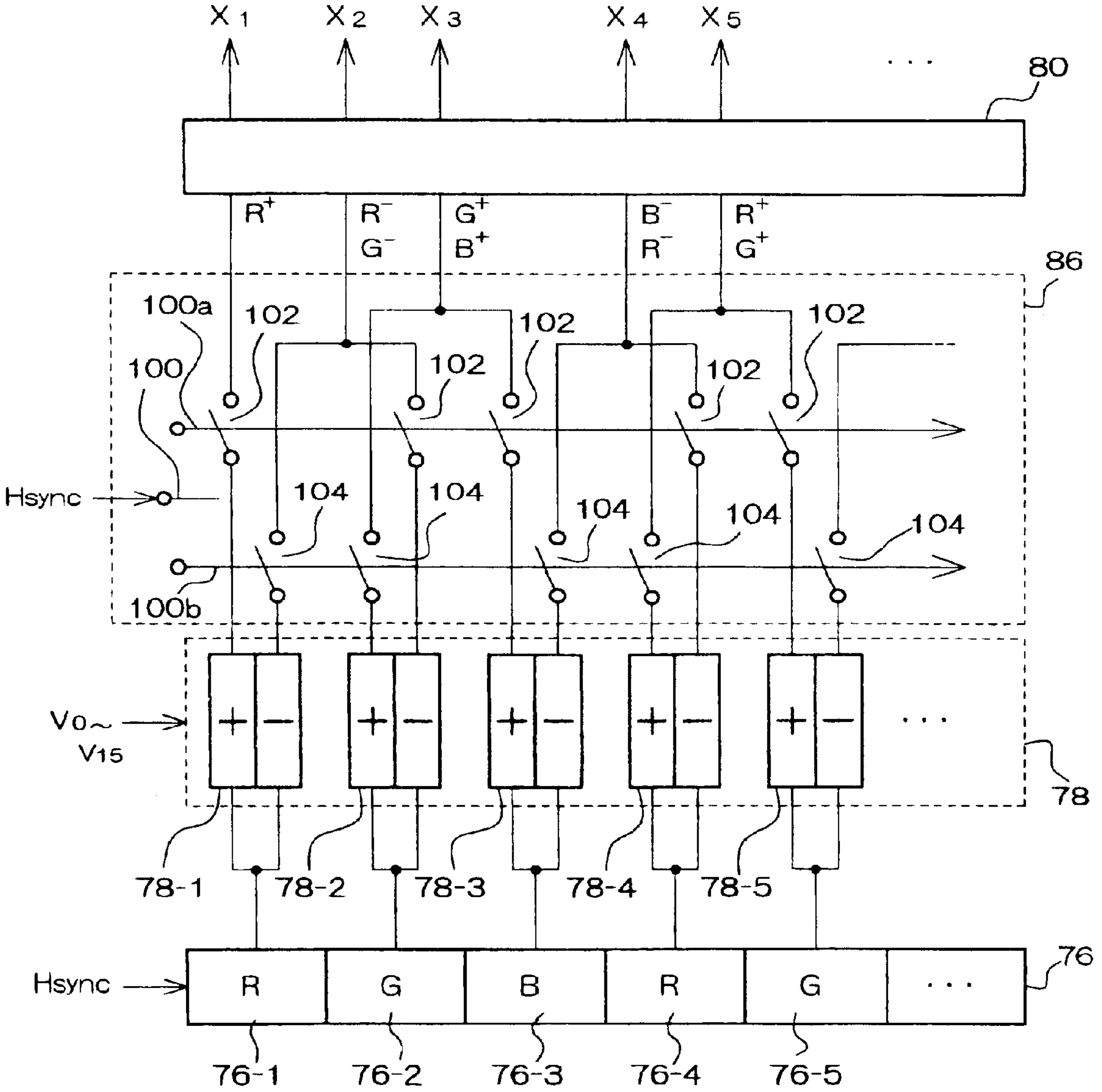
FIG. 7 is an internal block diagram that is configured differently from the internal block diagram of the data line driving circuit of FIG. 4.

A data line driving circuit shown in FIG. 7 has a data line switching circuit 86 that is configured differently from the data line switching circuit 84 shown in FIG. 4.

RGB data that are output from the latch circuit 76 shown in FIG. 7 are converted into positive and negative analog data by the positive and negative DA converters of the DA converters 78. The analog RGB signals are selected according to opening/closing control on switching elements 102 and 104 in the data line switching circuit 86, and then supplied to the data lines X via the voltage follower 80. For example, RGB data stored in the latch circuits 76-1 to 76-3 are supplied to the data lines $X_1$ to $X_4$ in the following manner. When a control line 100*a* is selected by a switching element 100, data $R^+$, $G^-$, and $B^+$ are supplied to the respective data lines $X_1$, $X_2$, and $X_3$. When a control line 100*b* is selected by the switching element 100, data $R^-$, $G^+$, and $B^-$ are supplied to the respective data lines $X_2$, $X_3$, and $X_4$. That is, a negative data signal voltage $R^-$ or $G^-$ is supplied to the data line $X_2$ and a positive data signal voltage $G^+$ or $B^+$ is supplied to the data line $X_3$.

This data line driving circuit enables the same operation as the data line driving circuit according to the first embodiment itself.

Second Embodiment

Figure 9:
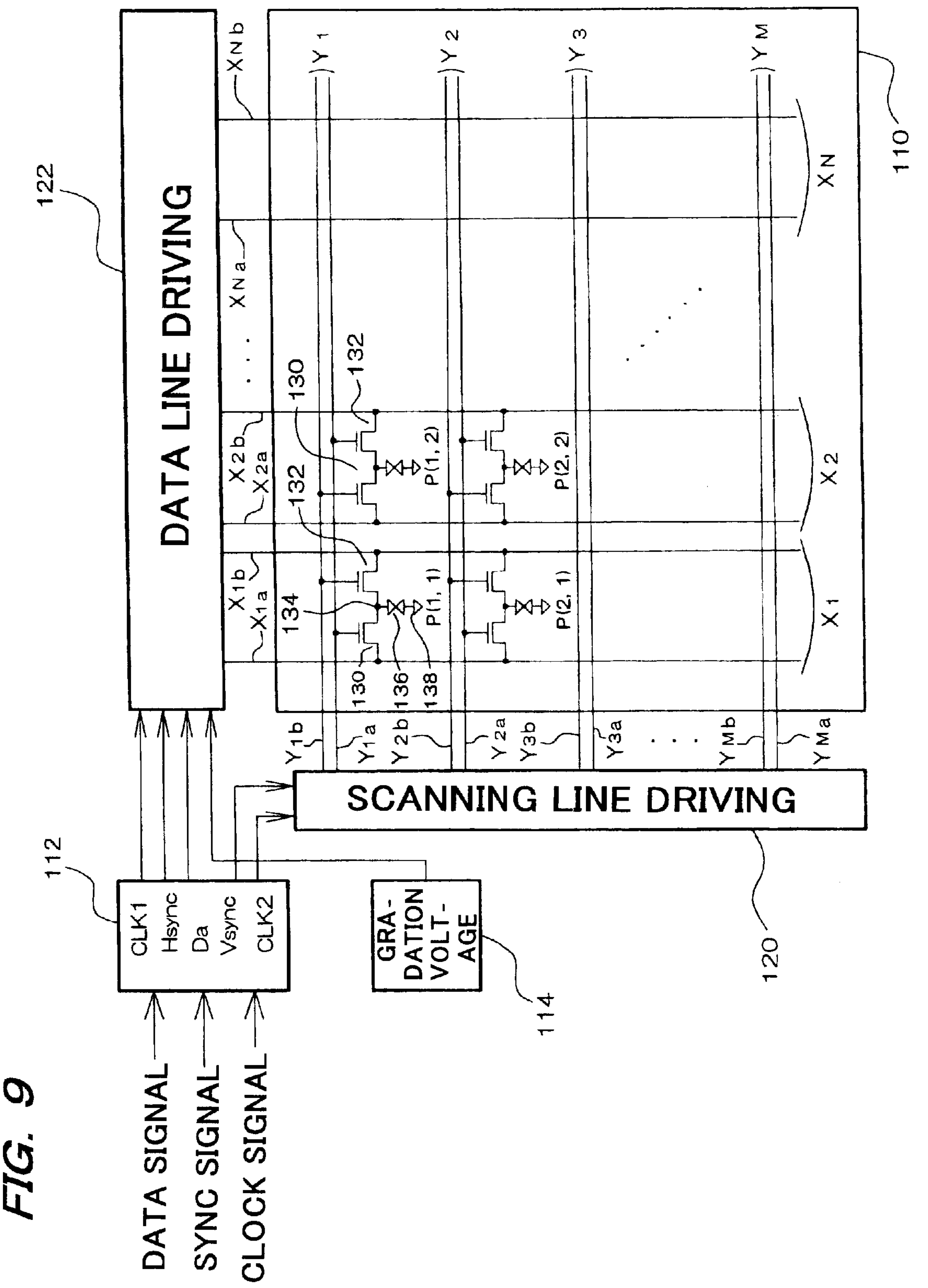
FIG. 9 shows a liquid crystal device according to a second embodiment of the invention.

FIG. 9 is a block diagram showing a TFT liquid crystal device according to a second embodiment of the invention. The liquid crystal device having this configuration provides the same advantages as the liquid crystal device according to the first embodiment does.

This liquid crystal device is composed of a liquid crystal panel 110, a signal control circuit section 112, a gradation voltage circuit section 114, a scanning line driving circuit 120, and a data line driving circuit 122. In FIG. 9, the individual pixels of the liquid crystal panel 110 are denoted by P (1, 1), . . . , P (M, N). Reference characters Y and X generically denote scanning lines and data lines, respectively, and symbols $Y_1$, $Y_2$, . . . , $Y_M$ and $X_1$, $X_2$, . . . , $X_N$ denote specific scanning lines and data lines. Moreover, $Y_{1a}$, $Y_{1b}$, $Y_{2a}$, $Y_{2b}$, . . . , $Y_{Ma}$, $Y_{Mb}$ denote further specific scanning lines, and $X_{1a}$, $X_{1b}$, $X_{2a}$, $X_{2b}$, . . . , $X_{Na}$, $X_{Nb}$ denote further specific data lines.

The scanning lines $Y_1$ to $Y_M$ and the data lines $X_1$ to $X_N$ are arranged and the (M×N) pixels are formed in the liquid crystal panel 110. Each of the scanning lines Y includes a pair of scanning lines; for example, the scanning line $Y_1$ includes scanning lines $Y_{1a}$ and $Y_{1b}$. Each of the data lines X includes a pair of data lines; for example, the data line $X_1$ includes data lines $X_{1a}$ and $X_{1b}$. In the pixel P (1, 1), for example, of the liquid crystal panel 110, the data line $X_{1a}$ and the scanning line $Y_{1a}$ are connected to the source and the gate, respectively, of a thin-film transistor (TFT) 130 and the data line $X_{1b}$ and the scanning line $Y_{1b}$ are connected to the source and the gate, respectively, of a thin-film transistor (TFT) 132. The drains of the TFTs 130 and 132 are connected to a pixel electrode 134. A pixel capacitor 136 is formed with the pixel electrode 134 as one end. The other (N×M−1) pixels P (1, 2) to P (M, N) each of which is connected to a pair of data lines have the same structure as the pixel P (1, 1).

The liquid crystal device of FIG. 9 is supplied externally with a data signal, a sync signal, and a clock signal.

The scanning line driving circuit 120 is supplied with a clock signal CLK2 and a vertical sync signal $V_{sync}$ from the signal control circuit section 12. The scanning line driving circuit 120 has the same configuration as the above-described scanning line driving circuit 20 shown in FIG. 2.

Figure 10:
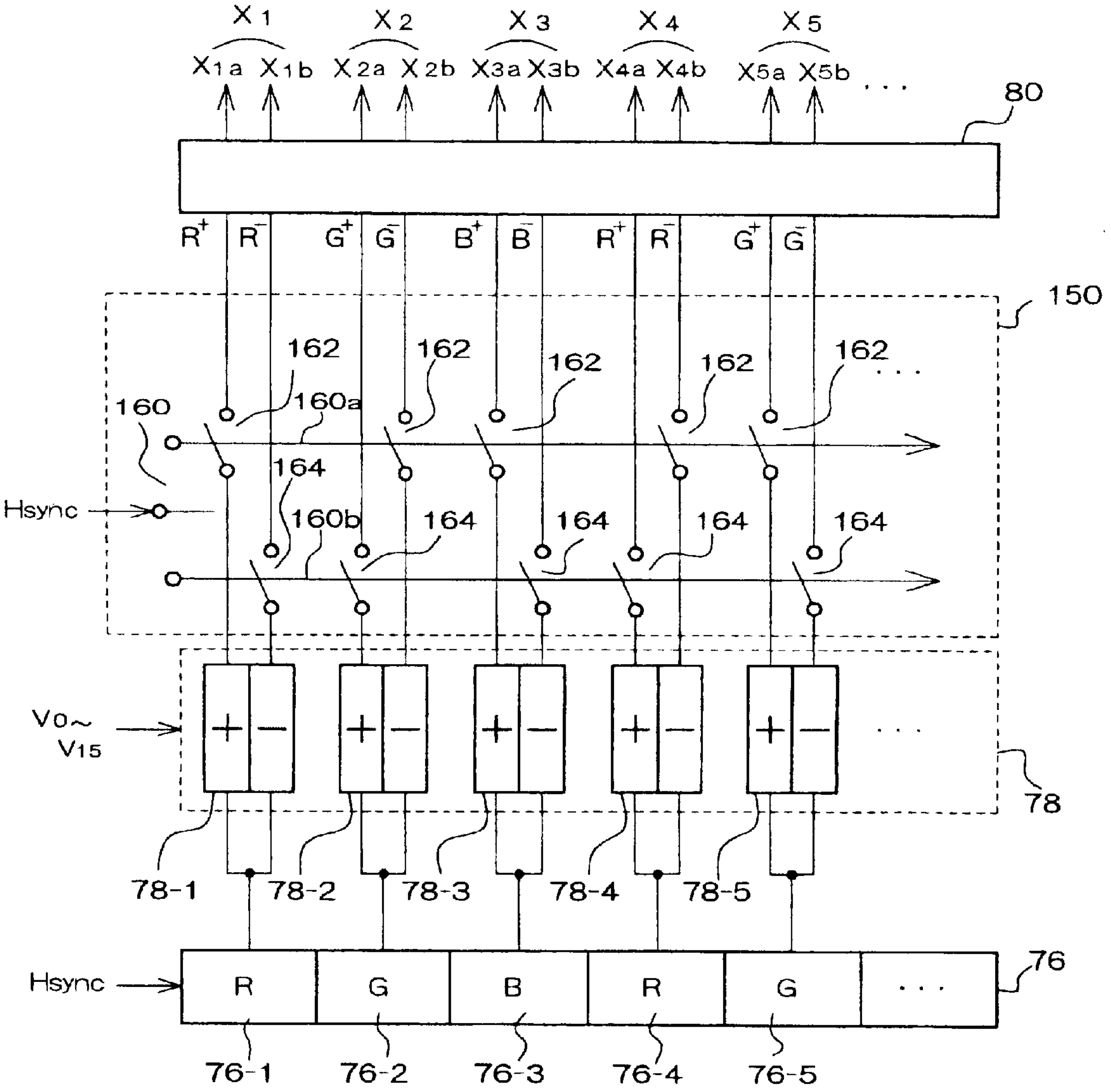
FIG. 10 is an internal block diagram showing a detailed configuration of a data line driving circuit of FIG. 9.

The data line driving circuit 122 is supplied with a clock signal CLK1, data signals $D_a$, and a horizontal sync signal $H_{sync}$ from the signal control circuit section 112. For example, as shown in FIG. 10, the data line driving circuit 122 has a data line switching circuit 150 that distributes, to the data lines X, analog data signal voltages obtained by converting the data signals $D_a$ (RGB signals). The data signals $D_a$ (RGB signals) that are output from a latch circuit 76 are converted by a DA converter 78 into positive and negative analog voltages, which are supplied to the data line switching circuit 150. A switching element 160 turns on switching elements 162 by selecting a control line 160*a* and turns on switching elements 164 by selecting a control line 160*b*. RGB data stored in the respective latch circuits 76-1 to 76-3, for example, are handled as follows. When the switching elements 162 are turned on, data $R^+$, $G^-$, and $B^+$ are supplied to the respective data lines $X_{1a}$, $X_{2b}$, and $X_{3a}$. When the switching elements 164 are turned on, data $R^-$, $G^+$, and $B^-$ are supplied to the respective data lines $X_{1b}$, $X_{2a}$, and $X_{3b}$.

Figure 11A:
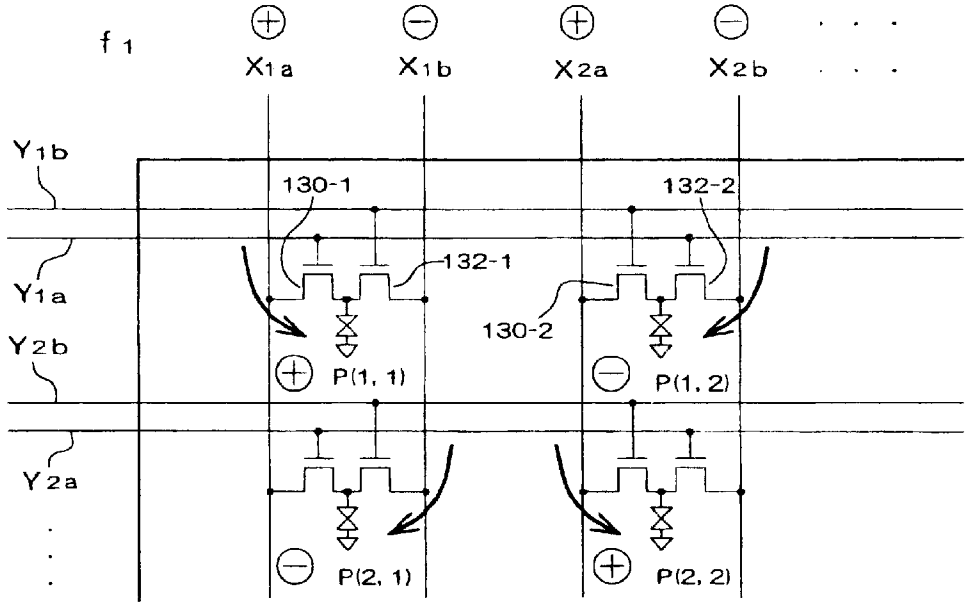
FIGS. 11A and 11B show polarity variations of the pixels of a liquid crystal panel shown in FIG. 9.
Figure 11B:
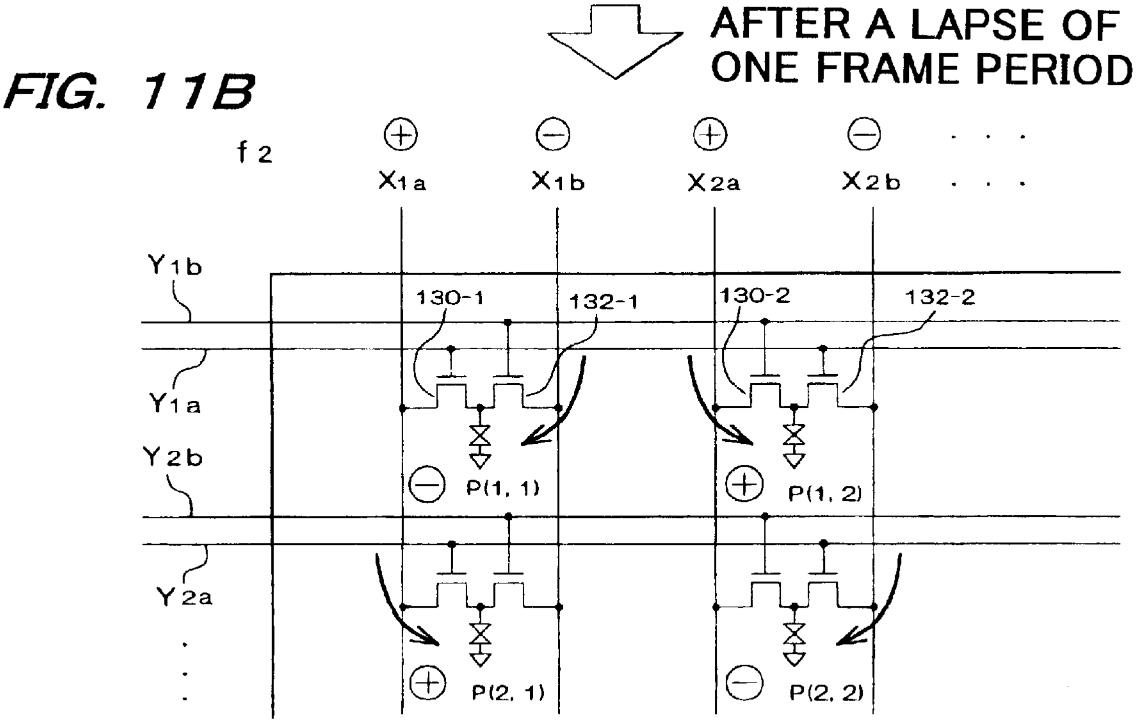
Figure 12A:
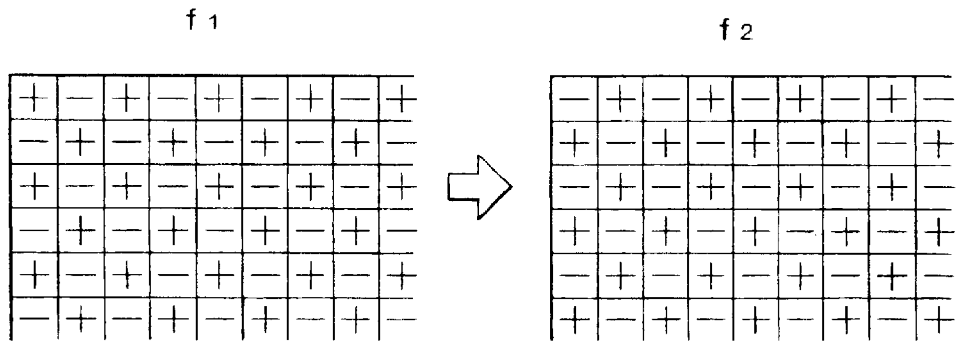
FIG. 12A shows polarity variations of the pixels of a conventional liquid crystal panel and FIG. 12B shows a timing chart of this polarity variations.
Figure 12B:
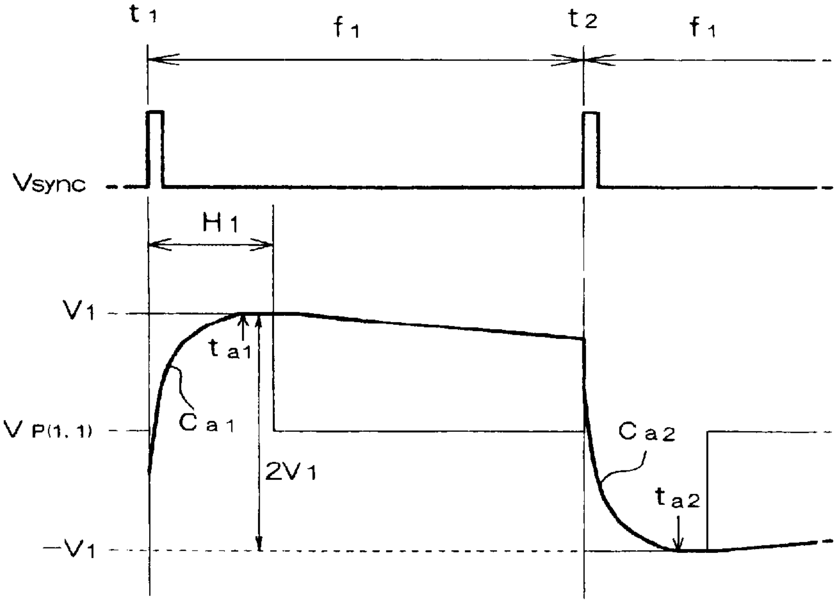

Referring to FIGS. 11A and 11B, a description will be made of how the polarities of the pixels of the liquid crystal panel 110 of the above liquid crystal device vary. As an example, FIGS. 11A and 11B shows operations relating to the four pixels P (1, 1) to P (2, 2).

In a selection period $H_1$ of a frame period $f_1$ shown in FIG. 11A when the scanning line $Y_{1a}$ is selected, an on-voltage is supplied to the control line 160*a* of the data line switching circuit 150 of the data line driving circuit 122, whereby the switching elements 162 are turned on. Therefore, as shown in FIG. 11A, data signal voltages $V_a$ ($R^+$ and $G^-$) are supplied to the respective data lines $X_{1a}$ and $X_{2b}$. The data signal voltages $V_a$ are supplied from the data lines $X_{1a}$ and $X_{2b}$ to the pixels P (1, 1) and P (1, 2), respectively. That is, positive and negative voltages build up in the respective pixels P (1, 1) and P (1, 2). Then, in a selection period $H_2$ when the scanning line $Y_{2b}$ is selected, an on-voltage is supplied to the control line 160*b* of the data line switching circuit 150 of the data line driving circuit 122, whereby the switching elements 164 are turned on. Therefore, as shown in FIG. 11A, data signal voltages $V_a$ ($R^-$ and $G^+$) are supplied to the respective data lines $X_{1b}$ and $X_{2a}$. The data signal voltages $V_a$ are supplied from the data lines $X_{1b}$ and $X_{2a}$ to the pixels P (2, 1) and P (2, 2), respectively. That is, negative and positive voltages build up in the respective pixels P (2, 1) and P(2, 2).

In a selection period $H_2$ of a frame period $f_2$ that follows the frame period $f_1$ when the scanning line $Y_{1b}$ is selected, an on-voltage is supplied to the control line 160*b* of the data line switching circuit 150 shown in FIG. 10 that is an internal circuit of the data line driving circuit 122 shown in FIG. 9, whereby the switching elements 164 are turned on. Therefore, as shown in FIG. 11B, data signal voltages $V_a$ ($R^-$ and $G^+$) are supplied to the respective data lines $X_{1b}$ and $X_{2a}$. The data signal voltages $V_a$ are supplied from the data lines $X_{1b}$ and $X_{2a}$ to the pixels P (1,1) and P (1, 2), respectively. That is, negative and positive voltages build up in the respective pixels P (1, 1) and P (1, 2). Then, in a selection period when the scanning line $Y_{2a}$ is selected, an on-voltage is supplied to the control line 160*a* of the data line switching circuit 150 of the data line driving circuit 122, whereby the switching elements 162 are turned on. Therefore, as shown in FIG. 11B, data signal voltages $V_a$ ($R^+$ and $G^-$) are supplied to the respective data lines $X_{1a}$ and $X_{2b}$. The data signal voltages $V_a$ are supplied from the data lines $X_{1a}$ and $X_{2b}$ to the pixels P (2, 1) and P (2, 2), respectively. That is, positive and negative voltages build up in the respective pixels P (2, 1) and P (2, 2).

The same advantages as in the first embodiment are obtained also in the above configuration in which the pixels are so arranged that the columns of pixels correspond to the respective data lines $X_1$ to $X_N$ each of which includes a pair of data lines, that is, a data line $X_{ma}$ to which a positive data signal line voltage is supplied and a data line $X_{mb}$ to which a negative data signal line voltage is supplied.

The invention is not limited to the above embodiments, and various modifications are possible without departing from the spirit and scope of the invention. For example, although each of the embodiments is directed to the TFT liquid crystal device, the invention can also be applied to the passive matrix liquid crystal device in which a liquid crystal material is sealed between two substrates in each of which X electrodes or Y electrodes are formed. In the latter case, passive elements having a capacitive electrical characteristic (e.g., capacitors) are provided so as to correspond to the electrodes X and Y that form the pixels. The application range of the invention is not limited to the above-described TFT liquid crystal device, and the invention can also be applied to, for example, image display apparatuses using the TFD (thin-film diode) that is a two-terminal device, the electroluminescence (EL) device, the plasma display device, or the like.

The invention can also be applied to other various electronic apparatuses such as cell phones, game machines, electronic notes, personal computers, word processors, TV receivers, and car navigation apparatuses.

What is claimed is:

1. An electro-optical device comprising:

a plurality of data line pairs extending in a first direction, each of the data line pairs including a first data line to which a data signal of a first polarity is supplied and a second data line to which a data signal of a second polarity is supplied;

a plurality of scanning lines extending in a second direction that intersects the first direction;

a plurality of pixels arranged at intersections of the data lines pairs and the scanning lines;

a scanning line driving circuit which supplies each of the scanning lines with a scanning signal for selecting one of the scanning lines in a selection period; and a data line driving circuit which includes a data line switching circuit and supplies the first and second data lines of the data line pairs with the data signals of the first and second polarities, respectively, wherein the data line switching circuit selects one of the first and second data lines of each of the data line pairs alternately along the second direction in a t-th selection period (t is a natural number) of a k-th (k is a natural number) frame period, and then in the (t+1)-th selection period, selects the other of the first and second data lines of each of the data line pairs which has not been selected in the t-th selection period.

2. The electro-optical device as defined in claim 1, wherein each adjacent pairs of the data line pairs share one data line as the first data line and the second data line.

3. The electro-optical device as defined in claim 1, wherein the data line switching circuit has a data line switching section;

wherein in a t-th selection period of a (k+1)-th frame period, the data line switching section selects one of the first and second data lines of each of the data line pairs which has not been selected in the t-th selection period of the k-th frame period; and wherein in the (t+1)-th selection period of the (k+1)-th frame period, the data line switching section selects the other of the first and second data lines of each of the data line pairs which has not been selected in the (t+1)-th selection period of the k-th frame period.

4. The electro-optical device as defined in claim 3, wherein the scanning lines are scanning line pairs each of which includes a first scanning line and a second scanning line;

wherein the electro-optical device further comprises:

a plurality of first switching elements each of which is connected to the first data line, the second scanning line of each of the scanning line pairs, and one of the pixels; and a plurality of second switching elements each of which is connected to the second data line, the first scanning line of each of the scanning line pairs, and one of the pixels.

5. The electro-optical device as defined in claim 4, wherein the scanning line driving circuit comprises:

a plurality of third switching elements each of which is connected to one of the first and second scanning lines of the scanning line pairs and turned on in the t-th selection period of the k-th frame period and in the (t+1)-th selection period of the (k+1)-th frame period; and a plurality of fourth switching elements each of which is connected to the other of the first and second scanning lines of each of the scanning line pairs and turned on in the (t+1)-th selection period of the k-th frame period and the t-th selection period of the (k+1)-th frame period.

6. The electro-optical device as defined in claim 4, wherein the data signals include a signal R, a signal G, and a signal B; and wherein one of the signals R, G and B is supplied to each of the first and second data lines which are provided at both ends in the second direction, and two of the signals R, G and B are supplied to each of the remaining first and second data lines.

7. The electro-optical device as defined in claim 1, wherein each of the pixels has a capacitive electrical characteristic.

8. The electro-optical device as defined in claim 1, wherein each of the pixels includes an electro-optical material that is driven by a thin-film transistor.

9. The electro-optical device as defined in claim 8, wherein the electro-optical material is a liquid crystal.

10. An electronic apparatus comprising the electro-optical device as defined in claim 1.

11. A method of driving an electro-optical device, wherein the electro-optical device comprises:

a plurality of data line pairs extending in a first direction, each of the data line pairs including a first data line to which a data signal of a first polarity is supplied and a second data line to which a data signal of a second polarity is supplied;

a plurality of scanning lines extending in a second direction that intersects the first direction;

a plurality of pixels arranged so as to correspond to intersections of the data lines pairs and the scanning lines;

a scanning line driving circuit which supplies each of the scanning lines with a scanning signal for selecting one of the scanning lines in a selection period; and a data line driving circuit which supplies the first and second data lines of the data line pairs with the data signals of the first and second polarities, respectively; and wherein the data line driving circuit selects one of the first and second data lines of each of the data line pairs alternately along the second direction in a t-th selection period (t is a natural number) of a k-th (k is a natural number) frame period, and then in the (t+1)-th selection period, selects the other of the first and second data lines of each of the data line pairs which has not been selected in the t-th selection period.

12. The method of driving an electro-optical device as defined in claim 11, wherein each of the pixels has a capacitive electrical characteristic.

13. The method of driving an electro-optical device as defined in claim 11, wherein each of the pixels includes an electro-optical material that is driven by a thin-film transistor.

14. The method of driving an electro-optical device as defined in claim 13, wherein the electro-optical material is a liquid crystal.

* * * * *